(12) United States Patent  
Fuergut et al.

(10) Patent No.: US 7,481,641 B2  
(45) Date of Patent: Jan. 27, 2009

(54) APPARATUS AND METHOD FOR PRODUCING AN ARTICLE BY MEANS OF A MOLDING TECHNIQUE

(75) Inventors: Edward Fuergut, Dasing (DE); Hai Guan Loh, Singapore (SG)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 11/626,090

(22) Filed: Jan. 23, 2007

(65) Prior Publication Data

US 2007/0178185 A1    Aug. 2, 2007

(30) Foreign Application Priority Data

Jan. 23, 2006    (DE) ...................... 10 2006 003 305

(51) Int. Cl.
*B29C 45/02*    (2006.01)
*B29C 45/26*    (2006.01)

(52) U.S. Cl. .................... 425/129.1; 425/215; 425/470; 425/544

(58) Field of Classification Search ................. 425/215, 425/470, 544, 129.1, 116, 127; 264/328.12
See application file for complete search history.

(56) References Cited

U.S. PATENT DOCUMENTS

| | | | |
|---|---|---|---|
| 5,572,434 A | 11/1996 | Wang et al. | 364/475.02 |
| 5,811,041 A | 9/1998 | Snow | 264/102 |
| 5,817,545 A | 10/1998 | Wang et al. | 438/127 |
| 5,840,222 A | 11/1998 | Herbst | 264/39 |
| 6,000,924 A | 12/1999 | Wang et al. | 425/125 |
| 6,023,962 A | 2/2000 | Wang et al. | 73/54.09 |
| 6,413,801 B1* | 7/2002 | Lin | 438/127 |
| 2004/0241049 A1* | 12/2004 | Carvalho | 422/100 |
| 2005/0106784 A1 | 5/2005 | Xia | 438/125 |

FOREIGN PATENT DOCUMENTS

| | | |
|---|---|---|
| DE | 19601280 | 1/1996 |
| DE | 69716507 | 4/1997 |
| EP | 0785060 | 1/1997 |
| EP | 0806274 | 4/1997 |
| JP | 11-026488 | * 1/1999 |

OTHER PUBLICATIONS http://en.wikipedia.org/wiki/Injection_molding "Injection Moulding" Wikipedia, Dec. 30, 2005.
http://www.offshoresolutions.com/products/plastic/injectionMolded.htm "Offshore Solution", Jan. 11, 2006.

* cited by examiner

*Primary Examiner*—Robert B Davis
(74) *Attorney, Agent, or Firm*—Banner & Witcoff, Ltd.

(57) ABSTRACT

To avoid air pockets (voids), for example when embedding semiconductor devices (15) in a plastic package molding compound, process parameters in transfer and compression molding are to be contemporaneously controlled. For this purpose, the tendency for voids to form is observed on the basis of test structures in control cavities (7), which form outwardly directed continuations of the mold cavity (3) of a capillary nature.

18 Claims, 2 Drawing Sheets

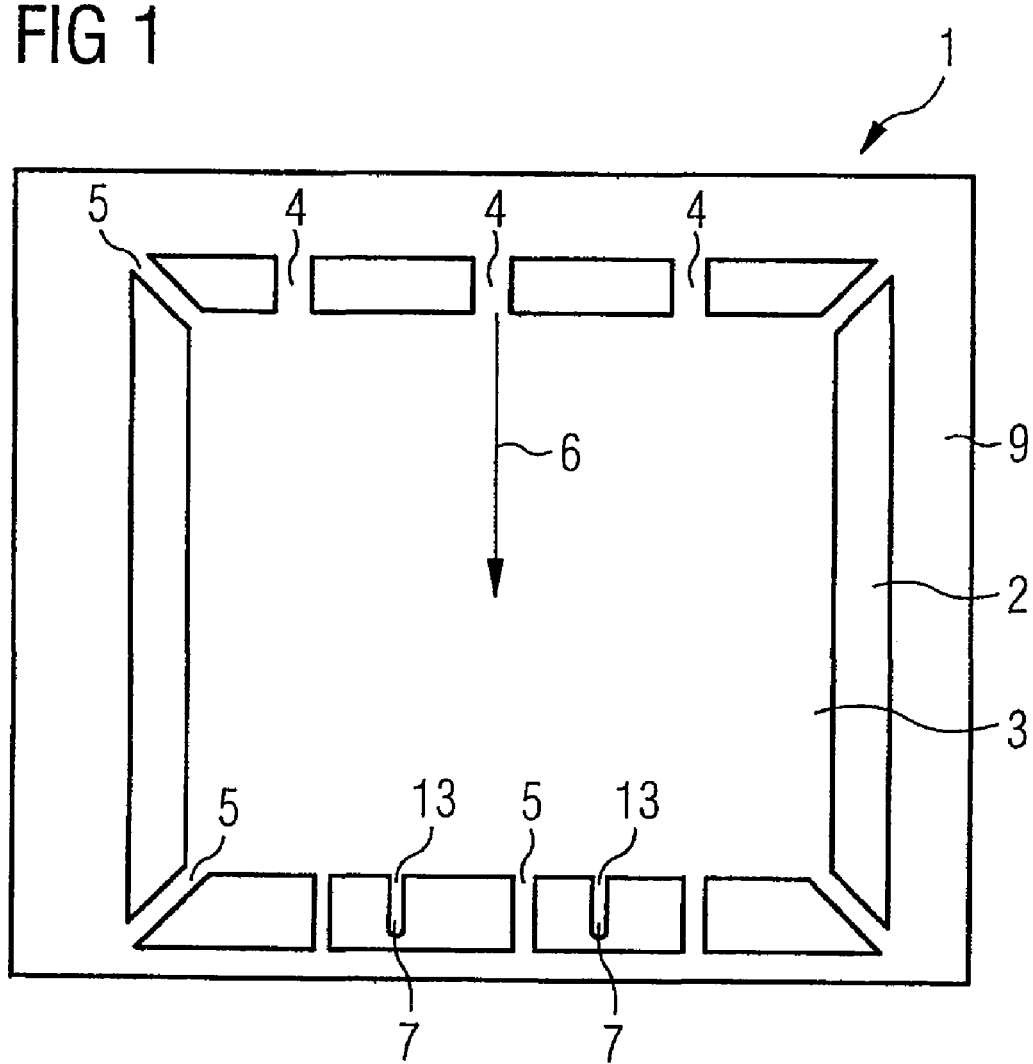

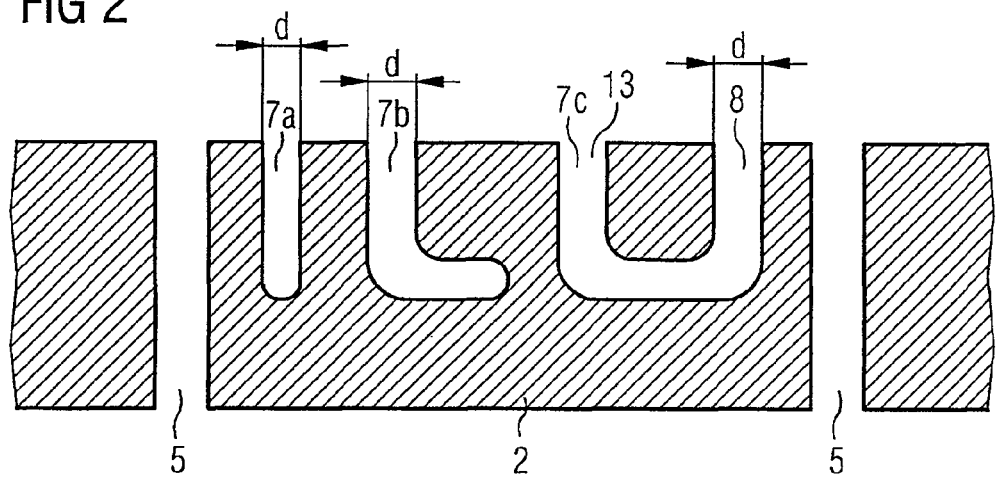
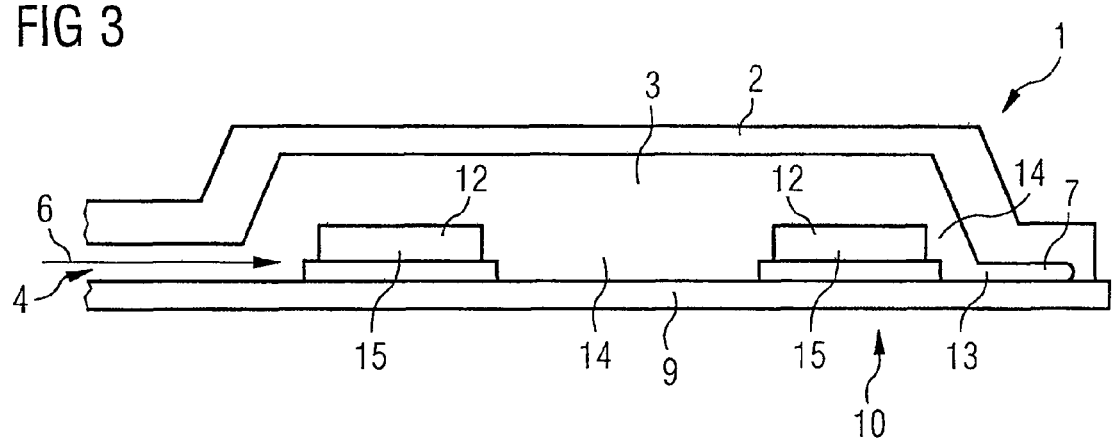

APPARATUS AND METHOD FOR PRODUCING AN ARTICLE BY MEANS OF A MOLDING TECHNIQUE

RELATED APPLICATION

This application claims priority from German Patent Application No. DE 10 2006 003 305.1, which was filed on Jan. 23, 2006, and is incorporated herein by reference in its entirety.

TECHNICAL FIELD

The invention relates to an apparatus for producing an article from a thermoplastic or thermosetting material by means of a molding technique. It also relates to a method for producing such an article.

BACKGROUND

Molding techniques or injection-molding methods are widely used for processing plastics. With them, many different articles can be produced, for example from thermoplastic or thermosetting materials. The techniques of transfer molding and compression molding are used particularly often.

In the case of compression molding, the molding material, which may for example take the form of a paste or a quantity of pellets and is generally preheated, is introduced into an open, usually heated mold cavity, which is subsequently closed. The molding material is pressed into the mold by the effect of a pressure and fills it completely. The molding material remains in the mold until it has completely cured.

In the case of transfer molding, on the other hand, a defined quantity of the molding material, typically a thermosetting material, is filled into the otherwise closed mold cavity through a gate. During transfer molding, the walls of the mold are typically heated to a temperature above the melting temperature of the molding material in order to obtain good flow properties of the material within the cavity.

A large number of different thermoplastic and thermosetting materials come into consideration both for compression molding and for transfer molding.

It is possible both in the case of compression molding and in the case of transfer molding to produce a large number of usually identical articles simultaneously if the mold has more than one mold cavity. In the case of transfer molding, the molding material is then usually introduced into the individual cavities simultaneously from the supply container through a branched feed line (sprue and runner).

In particular when thermosetting materials are used, which as a result of the contact with the hot mold crosslink to an increasing extent as they flow over an increasing distance, or highly viscous thermoplastic materials are used, in particular with a mold that is not heated, the formation of so-called voids (pockets of air or gas resembling bubbles or cracks) can cause flaws in the articles produced. Voids form in particular in regions within the mold cavity that are of a particularly intricate and capillary nature, and in cases where particularly small articles are produced.

Voids may represent blemishes, but may also lead to malfunctions of the article produced, for example in the case of semiconductor devices. Various efforts are therefore made to prevent the formation of voids.

For example, in the production of plastic packages for semiconductor devices by means of transfer molding, the air present in the mold cavity is removed through vents during the molding process. A negative pressure of approximately 100 mbar is thereby reached in the mold cavity. It is particularly favorable in this case if the vents are arranged in the wall of the mold cavity that lies opposite the gate, because in this case the air can be removed from the entire flow path of the molding material.

This so-called vacuum molding does improve the result of the molding process and reduces the probability of voids forming. However, in the production of articles with a geometry that is particularly intricate and with particularly small cavities of a capillary nature, such as for example plastic packages for semiconductor devices, the risk of voids forming is so great even in the case of vacuum molding that process parameters, such as for example the temperature of the molding material and of the mold cavity, and also the vacuum have to be controlled very precisely. It is problematical in this respect that, although constant control of the process parameters is necessary, there is no simple way of continuously monitoring the formation of voids in the mold cavity.

Generally, vacuum sensors are not used within the mold cavity. Monitoring of the vacuum in the mold cavity is therefore not possible. Since, however, even small leaks in the lines can lead to a relatively great increase in pressure in the mold cavity, and consequently have a great effect on the tendency for voids to form, a good vacuum must be ensured at all times if use of the vacuum is to achieve a reduction in the formation of voids.

SUMMARY

According to an embodiment, an apparatus for producing an article or a number of articles from a thermoplastic or thermosetting material by means of transfer molding may have a mold with walls which enclose at least one mold cavity and, for the or each mold cavity, a gate for introducing the thermoplastic or thermosetting material into the mold cavity. Arranged in or on its walls, the mold has control cavities, which form continuations of the mold cavity of a capillary nature.

BRIEF DESCRIPTION OF THE DRAWINGS

Exemplary embodiments of the invention are explained in more detail below on the basis of the accompanying figures.

FIG. 1 shows a schematic plan view of the apparatus for encapsulating a semiconductor device with a plastic package molding compound;

FIG. 2 shows a detail of this apparatus and

FIG. 3 schematically shows a cross section through this apparatus.

The same parts are provided with the same designations in all the figures.

DETAILED DESCRIPTION

According to different embodiments, direct observation of the molding material is on the one hand particularly necessary especially in regions of the article to be produced that are of an intricate, capillary nature, since voids have a propensity to form in these regions on account of the flow properties of the molding material. On the other hand, however, it is particularly difficult or even impossible to carry out an investigation of such regions for voids without disturbing the molding process. Instead, control cavities which offer conditions particularly conducive to the formation of voids by their geometry of a capillary nature should be provided in the walls of the mold.

"Of a capillary nature" is understood here and hereafter as meaning an area that is so narrow or intricate that the molding material reaches it with relative difficulty and has a tendency to form voids in it. What is considered to be "of a capillary nature" is therefore also dependent on the viscosity of the molding material, in particular in relation to the dimensions of the area of a capillary nature.

According to an embodiment, in the control cavities, the molding material forms test structures, which can be tested for the presence of voids. Since the control cavities have a geometry that is particularly conducive to the formation of voids, it can be assumed that the probability of void formation in the control cavities is at least as great as in the other regions of the mold.

According to an embodiment, if no void formation occurs in the control cavities, that is to say the test structures have no voids, it is also highly probable that the article produced is free from voids and the process conditions such as the temperature of the mold, the viscosity of the molding material and the vacuum are appropriate. In other words, the control cavities allow the formation of voids to be simulated under "worst-case" conditions. In this way it is therefore possible to obtain a pessimistic estimation of the void formation in the mold cavity.

According to an embodiment, the control cavities consequently do not enclose any part of the article to be produced but are merely "dummy cavities" for producing test structures, which though joined to the produced article after the molding process can easily be separated from it if so desired. The control cavities are arranged in or on the walls of the mold in such a way that they form continuations of the mold cavity. That is to say that the control cavities have in each case at least one opening toward the mold cavity, through which the molding material can flow into said cavity.

The apparatus according to an embodiment has the advantage that it allows contemporaneous monitoring of the process parameters in the molding process that are responsible for void formation in a relatively simple way. The test structures can be checked for voids immediately after curing of the molding material, so that, if there is an unsatisfactory result, it is possible for the process parameters to be re-adjusted and, if a vacuum is being used, in particular for a check to be made on the level of the vacuum in the mold cavity. Complicated measuring techniques and measuring instruments are not necessary for this.

When it is introduced into the mold, according to an embodiment, the molding material is typically in the form of a more or less viscous paste. Depending on the material used and on the temperature of the mold, it is possible that the material is increasingly crosslinked and becomes more viscous as it flows on its way into all parts of the mold cavity. It therefore has an increasing tendency to form voids as it flows over an increasing distance.

Therefore, according to an embodiment, a particularly suitable position for arranging the control cavities is the wall of the mold that lies opposite the gate with respect to the mold cavity, since this location is reached last by the molding material, when it is already in a highly crosslinked state. Therefore, according to an embodiment, control cavities are advantageously arranged at least at this location. However, it may also be of interest to arrange additional control cavities along the flow path of the material, in order to be able to trace the formation of voids as the viscosity of the material progressively increases.

According to an embodiment, the removal of air or gas from the mold cavity is a tried-and-tested means for reducing void formation. Moreover, it is particularly advantageous to combine the use of control cavities with the technique of vacuum molding, because they allow particularly simple and realistic monitoring of the vacuum level in the mold cavity.

According to an embodiment, the apparatus for producing an article by means of transfer molding therefore advantageously may have a means for producing a vacuum in the mold cavity and vents intended for removing air from the mold cavity. According to an embodiment, these vents are expediently arranged in the wall of the mold that lies opposite the gate, so that the flow path of the molding material can be influenced in an advantageous way by the venting. According to an embodiment, the control cavities can then be arranged for example between the vents or in the vicinity of the vents.

According to an embodiment, the use of control cavities is also suitable for the production of an article by means of compression molding. According to an embodiment, an apparatus for producing one or more articles by means of compression molding likewise may have a mold with walls which enclose at least one mold cavity. According to an embodiment, the mold can be opened to introduce the molding material and to remove the cured article and can be closed for the molding process. According to an embodiment, it has control cavities which form inwardly directed continuations of the or each mold cavity of a capillary nature.

According to different embodiments, various geometries are conceivable for the control cavities. In order to simulate the conditions within the mold cavity optimally and in order to allow an estimation of the void formation that is as exact as possible, a suitable shape and suitable dimensions should be chosen for the control cavities.

According to an embodiment, a particularly simple shape for the control cavities is the shape of a cylinder. The control cavities may, however, also be bent in an L-shaped or U-shaped manner. It must be expected in this respect that, given the same dimensions of the control cavities, the probability of void formation is greatest in control cavities that are bent in a U-shaped manner, with both legs of the U opening into the mold cavity, because the molding material must penetrate into both legs and in each case flow around a bend in order to fill the outermost angle of the control cavity. It goes without saying that other geometries are also conceivable for control structures.

According to different embodiments, furthermore, control cavities with various different "void-prone" geometries and/or dimensions may be arranged in the walls of a mold. This is advantageous in particular whenever the article to be produced has a complicated geometry or when the transition between a molding that is void-free and a molding that is not void-free is to be investigated, for example in order to set the process parameters optimally.

Moreover, according to an embodiment, it is conceivable to provide the control cavities in or on the walls of the mold in such a way that they can be exchanged for control cavities of different geometries and/or dimensions. It is consequently possible to simulate as exactly as possible the conditions for void formation prevailing in the mold cavity even under changed process conditions, such as for example a different temperature or a different composition of the molding material.

According to an embodiment, the suitable dimensions for the control cavities depend in particular very strongly on the dimensions of the article to be produced. Since the formation of voids occurs in particular in the case of relatively small articles, advantageous control cavities are those with a cross section of an average diameter d where $10\ \mu m \leq d \leq 100\ \mu m$. Since the control cavities may be irregularly shaped, d merely represents an average diameter or a dimension that is characteristic of the control cavity concerned.

An apparatus according to an embodiment is suitable in particular for embedding semiconductor devices in a plastic package molding compound. Semiconductor devices are surrounded with the plastic package molding compound either individually or in a panel.

They have a multiplicity of clearances and projections, such as for example bonding wires, solder balls, narrow gaps between chips stacked one on top of the other, which are to be filled with plastic package molding compound, or parts with a relatively great extent transversely in relation to the direction of flow, which under some circumstances are not flowed around completely by the plastic package molding compound if it becomes viscous too early. These are some examples of regions of a capillary nature in which void formation easily occurs and which can no longer be investigated for possible voids after the semiconductor device is embedded in a plastic package molding compound without the device being destroyed.

According to an embodiment, the use of control cavities to form test structures is therefore a particularly simple way of estimating the risk of void formation when semiconductor devices are embedded in a plastic package molding compound and of contemporaneously re-adjusting critical process parameters, such as in particular the vacuum level in the mold cavity, if this is necessary.

According to an embodiment, semiconductor devices may either be individually surrounded with a plastic package molding compound or they are embedded in the plastic package molding compound in a panel and only singulated after curing. The apparatus according to an embodiment can be used for both methods, the shape and dimensions of the mold cavity differing in each case.

According to an embodiment, a method for producing an article or a number of articles from a thermoplastic or thermosetting material by means of transfer molding may comprise providing a mold with walls which enclose at least one mold cavity with the shape and dimensions of the article to be produced, and with control cavities arranged in the walls and forming continuations of the mold cavity of a capillary nature, and providing a thermoplastic or thermosetting material in a softened state. This material is introduced into the mold cavity and into the control cavities through a gate, test structures forming in the control cavities.

According to an embodiment, the pressure inside the mold cavity can be measured and the mold cavity can be filled with thermoplastic or thermosetting material until a predetermined pressure that indicates adequate filling of the mold cavity is reached. Subsequently, the molding material is cured and the finished article is removed from the mold cavity. Testing the test structures for voids can then take place immediately, so that subsequent controlling of process parameters is possible without delay. For better avoidance of void formation, the mold cavity may be evacuated before and/or during the introduction of the molding material, an advantageous pressure p being where $1 \text{ mbar} \leq p \leq 200$ mbar. A pressure of $5 \text{ mbar} \leq p \leq 20$ mbar is the preferred aim. A much lower pressure can lead to undesired outgassing of constituents of the molding material, a much higher pressure does not have an adequate influence on the reduction of void formation.

According to an embodiment, if the article is produced by means of compression molding, the thermoplastic or thermosetting material is introduced into the opened mold. The mold is subsequently closed and subjected to a pressure, so that the molding material completely fills the mold cavity and test structures form in the control cavities. After curing of the material, the article can be removed and testing of the test structures for air pockets can be performed.

According to an embodiment, the described methods of transfer molding and compression molding can be used for example to surround semiconductor devices with a plastic package molding compound. For this purpose, the "bare" semiconductor devices are placed in the mold and are embedded in the plastic package molding compound by the molding operation.

According to an embodiment, testing the test structures may for example be performed optically, by scanning their surface by means of laser triangulation, by weighing the test structures or by ultrasound. For this purpose, the test structures may be separated from the produced article before or after the test. However, depending on the method of test, it is also possible to dispense with separation if the presence of the test structures on the produced article is not troublesome.

According to an embodiment, the use of control cavities and the analysis of the test structures may provide an extremely simple method of observing and even quantifying the tendency for voids to form in a molding process. No complex changes to the design of the molds or expensive sensors are necessary for this. The method is therefore also not particularly susceptible to errors and additionally has the advantage that it allows very realistic assessments of the tendency for voids to form to be made directly and not by a proxy such as the vacuum level or the viscosity of the material.

FIG. 1 shows an apparatus for encapsulating semiconductor devices with a plastic package molding compound by means of transfer molding. The apparatus has a mold 1 with walls 2, which surround a mold cavity 3. The bottom of the mold cavity 3 is formed by a base 9. The mold cavity 3 can be evacuated by means of a vacuum system (not represented) through one or more vents 5, whereby the base 9 is sucked against the mold 1 and forms a seal with the walls 2.

During the transfer molding process, thermoplastic or thermosetting material in a softened state is introduced into the mold cavity 3 through one or more gates 4 and flows in the direction of the arrow 6 into the mold cavity 3 until the latter is adequately filled. Complete filling of the mold cavity 3 is indicated for example by pressure sensors (not represented). Even during the molding operation, the mold cavity 3 is evacuated through the vents 5. In this way it is intended to prevent the formation of voids.

Voids occur if air is trapped in relatively viscous material. Void formation is particularly probable in regions in which the material has to flow through narrow openings or around sharp corners and also regions of the mold cavity 3 that are only reached by the material after a comparatively long flow path. This is so because, as it flows, the degree of crosslinking of the material typically increases, and consequently so does its viscosity.

It may happen that small fluctuations of the vacuum level or small leaks in the lines of the vacuum system are not detected and lead to a relatively great deterioration in the vacuum within the mold cavity 3. Such fluctuations and faults should be discovered and rectified as soon as possible, since they result in an increased tendency for voids to form.

To allow the tendency for voids to form to be directly observed, quantified and reduced if appropriate by the re-adjustment of process parameters, the mold 1 has a number of control cavities 7 in its walls 2. These control cavities 7 form continuations of the mold cavity 3, that is to say are accessible from the latter through openings 13. The control cavities 7 have the task of providing the "worst-case" conditions for void formation. They are capillary in nature, that is to say made relatively narrow, and if appropriate also intricate, and correspond in their dimensions approximately to the dimensions of areas with a particular tendency for voids to form. They may be arranged in the wall 2 which lies opposite the gates 4, so that the material has flowed over as great a distance as possible by the time it reaches them. Consequently, the control cavities 7 offer the most realistic possible upper estimation of the tendency for voids to form in the mold cavity 3.

During the molding process, the thermoplastic or thermosetting material flows through the openings 13 into the control cavities 7 and forms test structures in them. The test structures are cured together with the plastic package of the semiconductor device and can subsequently be removed together with the latter from the mold 1. The test structures are tested for the presence of voids, many methods being conceivable for this, such as weighing the test structures, inspection of the surface by means of laser triangulation or ultrasound. If voids are registered in the test structures, process parameters such as the vacuum level in the mold cavity 3 can be re-adjusted immediately, so that void formation is avoided the next time the process is performed.

Various shapes are conceivable for the control cavities 7, some of which are represented by way of example in FIG. 2. The control cavities 7, which may be arranged for example between the vents 5 in the walls 2 of the mold 1, may be virtually cylindrical like the control cavity 7a. They may, however, also be L-shaped like the control cavity 7b according to an alternative embodiment. U-shaped control cavities 7c or even more complicated structures are also conceivable. A U-shaped control cavity 7c generally offers more conducive conditions for the formation of voids than a cylindrical control cavity 7a, since it requires molding material to penetrate into both legs 8 of the U and flow around two bends. By choosing a suitably shaped control cavity 7, the conditions for void formation within the mold cavity 3 can be simulated particularly realistically.

The dimensions of the control cavities 7 play a particularly important role. They must correspond approximately to the dimensions of regions that are particularly prone to void formation. The control cavities 7 have a characteristic diameter d, which in the case of the production of plastic packages for semiconductor devices should lie between 10 μm and 100 μm. The diameter d is merely an average value, characteristic of the geometry of the control cavities 7; the control cavities 7 do not have to be round in their cross section and also do not have to be uniformly dimensioned over their entire length.

FIG. 3 shows a cross section through the mold 1, the base 9 having applied to it in device positions 10 a number of semiconductor devices 15 with at least one semiconductor chip 12, which are to be embedded in a plastic package molding compound that is introduced into the mold cavity 3 through one or more gates 4. A thermoplastic or thermosetting material in a softened state, for example in the form of a relatively viscous paste, is used as the material and is injected into the mold cavity in the direction of the arrow 6. The regions 14 in the "lee" of the semiconductor devices 15 are particularly prone to the formation of voids, since it may happen that the relatively viscous material does not completely enclose the semiconductor devices 15 and air pockets form behind them. However, other regions of a capillary nature in the vicinity of the semiconductor devices 15 may also be prone to the formation of voids, the tendency for voids to form increasing as the material flows over an increasing distance or as the molding process progresses.

In the particularly prone region of the wall 2 which lies opposite the gates 4, at least one control cavity 7 is arranged. To be able to make better assessments of the probability of voids forming, it is also conceivable to arrange a multiplicity of control cavities in the walls 2 of the mold 1, since the space between the vents 5 that is available in any case can be used in this way.

The control cavity 7 forms a kind of gap between the mold 1 and the base 9, that is to say it is bounded in the downward direction by the base 9 and in the upper direction and to the sides by the walls 2 of the mold 1. After curing, the mold 1 can consequently be opened slightly by lifting from the base 9, and the semiconductor device or devices 15 with the attached test structures can be removed. The base 9 may also be, for example, a wiring substrate or a flat conductor frame.

LIST OF DESIGNATIONS 1 mold
2 wall
3 mold cavity
4 gate
5 vent
6 arrow
7 control cavity
7a control cavity according to a first embodiment
7b control cavity according to a second embodiment
7c control cavity according to a third embodiment
8 leg
9 base
10 device position
12 semiconductor chip
13 opening
14 region
15 semiconductor device

What is claimed is:

1. An apparatus for producing an article or a number of articles from a thermoplastic or thermosetting material using transfer molding comprising:
a mold with walls which enclose a mold cavity, the mold cavity having a gate for introducing the thermoplastic or thermosetting material into the mold cavity, wherein the mold has a plurality of control cavities that form outwardly directed continuations of the mold cavity of a capillary nature and that are open only on an inner surface of the walls facing the cavity.

2. The apparatus according to claim 1, wherein one or more of the control cavities are arranged in the walls of the mold that lie opposite the gate with respect to the mold cavity.

3. The apparatus according to claim 1, further comprising means for producing a vacuum in the mold cavity and vents for removing air from the mold cavity.

4. The apparatus according to claim 1, wherein each of the control cavities has a form of a substantially cylindrical, tube-like continuation of the mold cavity.

5. The apparatus according to claim 1, wherein each of the control cavities has a form of a hose-like continuation of the mold cavity that is bent in an L-shaped manner.

6. An apparatus for producing an article or a number of articles from a thermoplastic or thermosetting material using transfer molding comprising:
a mold with walls which enclose a mold cavity, the mold cavity having a gate for introducing the thermoplastic or thermosetting material into the mold cavity, wherein the mold has a plurality of control cavities that form outwardly directed continuations of the mold cavity of a capillary nature, wherein each of the control cavities has a form of a tube-like continuation of the mold cavity that is bent in a U-shaped manner, the two legs of the U shape opening toward the mold cavity.

7. The apparatus according to claim 1, wherein the control cavities are of different shapes and are arranged in the walls of the mold.

8. An apparatus for producing an article or a number of articles from a thermoplastic or thermosetting material using transfer molding comprising:
a mold with walls which enclose a mold cavity, the mold cavity having a gate for introducing the thermoplastic or thermosetting material into the mold cavity, wherein the mold has a plurality of control cavities that form outwardly directed continuations of the mold cavity of a capillary nature, wherein the control cavities are exchangeably arranged in the walls of the mold.

9. The apparatus according to claim 1, wherein each of the control cavities has a cross section of an average diameter d, where 10 µm≦d≦100 µm.

10. An apparatus for producing an article from a thermoplastic or thermosetting material using compression molding, comprising:
a mold with walls which enclose a mold cavity, wherein the mold has a plurality of control cavities which form outwardly directed indentations of the mold cavity that are of a capillary nature.

11. The apparatus according to claim 10, wherein each of the control cavities has a form of a substantially cylindrical, tube-like continuation of the mold cavity.

12. The apparatus according to claim 10, wherein each of the control cavities has a form of a hose-like continuation of the mold cavity that is bent in an L-shaped manner.

13. An apparatus for producing an article from a thermoplastic or thermosetting material using compression molding, comprising:
a mold with walls which enclose a mold cavity, wherein the mold has a plurality of control cavities which form outwardly directed continuations of the mold cavity of a capillary nature, wherein each of the control cavities has a form of a tube-like continuation of the mold cavity that is bent in a U-shaped manner with two legs, the two legs of the U shape opening toward the mold cavity.

14. The apparatus according to claim 10, wherein the control cavities are of different shapes and are arranged in the walls of the mold.

15. An apparatus for producing an article from a thermosetting material using compression molding, comprising:
a mold with walls which enclose a mold cavity, wherein the mold has a plurality of control cavities which form outwardly directed continuations of the mold cavity of a capillary nature, wherein the control cavities are exchangeably arranged in the walls of the mold.

16. The apparatus according to claim 10, wherein each of the control cavities has a cross section of an average diameter d, where 10 µm≦d≦100 µm.

17. The apparatus according to claim 10 for embedding individual semiconductor devices in a plastic package molding compound.

18. The apparatus according to claim 10 for embedding semiconductor devices in a panel in a plastic package molding compound.

\* \* \* \* \*

UNITED STATES PATENT AND TRADEMARK OFFICE
CERTIFICATE OF CORRECTION

PATENT NO. : 7,481,641 B2
APPLICATION NO. : 11/626090
DATED : January 27, 2009
INVENTOR(S) : Edward Fuergut et al.

Page 1 of 1

It is certified that error appears in the above-identified patent and that said Letters Patent is hereby corrected as shown below:

In Column 10, Claim 15, Line 14:
Please delete "from a thermosetting material" and insert --from a thermoplastic or thermosetting material--.

Signed and Sealed this

Fifth Day of May, 2009

JOHN DOLL
*Acting Director of the United States Patent and Trademark Office*